United States Patent [19]

Nelson et al.

[11] Patent Number: 5,838,542
[45] Date of Patent: Nov. 17, 1998

[54] PROCESSOR CARD ASSEMBLY INCLUDING A HEAT SINK ATTACHMENT PLATE AND AN EMI/ESD SHIELDING CAGE

[75] Inventors: Darul J. Nelson, Beaverton; James V. Noval, Portland; Ricardo E. Suarez, Beaverton, all of Oreg.; Mostafa A. Aghazadeh, Chandler, Ariz.

[73] Assignee: Intel Corporation, Santa Clara, Calif.

[21] Appl. No.: 723,027

[22] Filed: Sep. 30, 1996

[51] Int. Cl.⁶ .............................. H05K 7/20; H05K 9/00
[52] U.S. Cl. ..................... 361/704; 174/35 R; 361/715; 361/718; 361/737; 361/818
[58] Field of Search ............................. 174/35 R, 35 GC; 235/487, 492; 361/704, 707, 709–710, 714–721, 737, 753, 759, 816, 818; 439/76.1

[56] References Cited

U.S. PATENT DOCUMENTS

| | | |
|---|---|---|
| Re. 34,393 | 9/1993 | McIlwraith . |
| 3,895,267 | 7/1975 | Cordon et al. ........................ 361/818 |
| 4,110,552 | 8/1978 | Lombardi . |
| 4,717,989 | 1/1988 | De Barros et al. . |
| 4,910,434 | 3/1990 | Doumani et al. . |
| 5,006,667 | 4/1991 | Lonka . |
| 5,014,160 | 5/1991 | McCoy, Jr. . |
| 5,020,866 | 6/1991 | McIlwraith . |
| 5,043,534 | 8/1991 | Mahulikar et al. . |
| 5,250,752 | 10/1993 | Cutright . |
| 5,278,351 | 1/1994 | Herrick . |
| 5,289,347 | 2/1994 | McCarthy et al. . |
| 5,294,994 | 3/1994 | Robinson et al. . |
| 5,303,113 | 4/1994 | Goleman et al. . |
| 5,309,315 | 5/1994 | Naedel et al. . |
| 5,323,299 | 6/1994 | Weber . |
| 5,333,100 | 7/1994 | Anhalt et al. . |
| 5,354,951 | 10/1994 | Lange, Sr. et al. . |
| 5,398,822 | 3/1995 | McCarthy et al. . |
| 5,422,433 | 6/1995 | Rivera et al. . |
| 5,430,607 | 7/1995 | Smith . |
| 5,473,111 | 12/1995 | Hattori . |
| 5,477,421 | 12/1995 | Bethurum . |
| 5,483,423 | 1/1996 | Lewis et al. . |
| 5,550,713 | 8/1996 | Pressler et al. ........................ 361/818 |
| 5,659,459 | 8/1997 | Wakabayashi et al. ................. 361/753 |

Primary Examiner—Gregory D. Thompson
Attorney, Agent, or Firm—Blakely, Sokoloff, Taylor & Zafman

[57] ABSTRACT

The processor card assembly of the present invention includes a processor card, a metallic plate and a back cover. The processor card includes a circuit board having a processor mounted thereto. The circuit board includes a first and a second plurality of fastening features. The metallic plate has a third and a fourth plurality of fastening features. The third plurality of fastening features cooperate with the first plurality of fastening features for physically attaching and thermally coupling the processor to the metallic plate, to serve as a base for further thermally coupling the processor to a heat sink. The back cover has a fifth plurality of fastening features that cooperate with the second plurality of fastening features of the circuit board and the fourth plurality of fastening features of the metallic plate to allow the metallic plate and the back cover to physically and electromagnetically form a Faraday cage enclosing the processor card to shield off electro-magnetic interference emissions and electrostatic discharge from the processor.

9 Claims, 8 Drawing Sheets

PROCESSOR CARD ASSEMBLY INCLUDING A HEAT SINK ATTACHMENT PLATE AND AN EMI/ESD SHIELDING CAGE

BACKGROUND OF THE INVENTION

1. Field of the Invention

The present invention relates to the field of microprocessor based computer systems. More specifically, the present invention relates to the packaging of high performance microprocessors on daughter cards, including the provision of heat sinks as well as electro-magnetic interference (EMI) and electrostatic discharge (ESD) shielding.

2. Background Information

Historically, when microprocessor was first commercialized, each microprocessor held less than one million transistors, and operated at speeds below 20 MHz. Typically, the microprocessors were either solder mounted onto the motherboards directly or mounted to the motherboards through sockets. They were typically air cooled, and air flow was typically sustained by a system fan. EMI/ESD shielding was not much of a concern.

In the pursuing years, the number of transistors packed into each microprocessor, as well as its operating speed have increased dramatically, especially in recent years. Correspondingly, the amount of heat that needs to be dissipated, as well as the amount of EMI emissions that needs to be absorbed and sensitivity to ESD during operation have increased. As a result, most of today's microprocessor based computer systems employ either local fans and/or heat sinks to help ensure that the microprocessors will run cool. At the same time, increased attentions have also been given to the design of system chassis to ensure the EMI emission absorption and ESD requirements are met.

This trend of increased transistor density and operating speed is expected to continue without any abatement. By the end of this year, it is expected that a typical desktop computer system will be powered by a microprocessor packing well over five million transistors, and operating in speeds in excess of 200 MHz. It is expected that because of the amount of heat needs to be dissipated, the precision of bonding between the processor and heat sink will reach a point of critical importance to ensure the processor will be cooled properly during operation. It is also expected that the size of the heat sink required for any one of these processors will be increased to a point that the spatial constraints imposed by the various de-facto system chassis form factors[1] must be addressed. In other words, it is unlikely that one heat sink will work (size-wise) for the various de-facto system chassis. At the same time, it is expected that the present system chassis based solution for EMI emission and ESD containment will no longer be adequate.

[1]Over the years, for compatibility and other reasons, a number of popular system chasis have been "adopted" by the microprocessor based computer system manufacturers, especially in the desktop sector, as de-facto form factors.

The heat sink problem is a dilemma for processor manufacturers. On one hand, because of the critical importance of the precision of bonding between a processor and a heat sink, a processor manufacturer cannot simply leave the job of bonding heat sinks to these high performance processors to the OEMs. However, if the processor manufacturers were to shoulder the burden of bonding the heat sinks, under the prior art, in addition to the burden of having to deal with yet another increase in heat sink size, the new burden of having to have multiple versions of heat sinks for one processor, the processor manufacturer will also have to shoulder the burden of having to stock and ship multiple versions of a processor bonded with different types of heat sinks.

Thus, it is desirable to have a new approach to cooling as well as EMI/ESD shielding microprocessors.

SUMMARY OF THE INVENTION

In view of the limitations of the prior art, and the above described desire, a new innovative processor card assembly is invented. The processor card assembly of the present invention includes a processor card, a metallic plate and a back cover. The processor card includes a circuit board having a processor mounted thereto. The circuit board includes a first and a second plurality of fastening features. The metallic plate has a third and a fourth plurality of fastening features. The third plurality of fastening features cooperate with the first plurality of fastening features for physically attaching and thermally coupling the processor to the metallic plate, to serve as a base for further thermally coupling the processor to a heat sink. The back cover has a fifth plurality of fastening features that cooperate with the second plurality of fastening features of the circuit board and the fourth plurality of fastening features of the metallic plate to allow the metallic plate and the back cover to physically and electro-magnetically form a Faraday cage enclosing the processor card to shield off electro-magnetic interference emissions from the processor. The metallic plate and the back cover also serve to provide an effective ESD shield around the processor and other electronic components on the processor card.

In one embodiment, the metallic plate further includes a channel longitudinally spanning the metallic plate, and a number of openings disposed thereon for facilitating strapping of a heat sink of a first type to the metal plate. For this embodiment, the processor card assembly further includes a front cover have a hollowed face for attaching to the circuit board over the metallic plate. The front cover further includes a number of the notches disposed on the perimeter for facilitating alternative strapping of a heat sink of a second type to the metal plate. The circuit board, the metallic plate, and the front and back covers are coordinated in height to provide physical protection to a number of connecting pins of circuit board, for connecting the circuit board to a connector disposed on a motherboard.

In an alternate embodiment, the metallic plate includes multiple sets of mounting holes for direct fastening of a selected one of different embodiments of heat sinks to the metallic plate.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Figure 1:
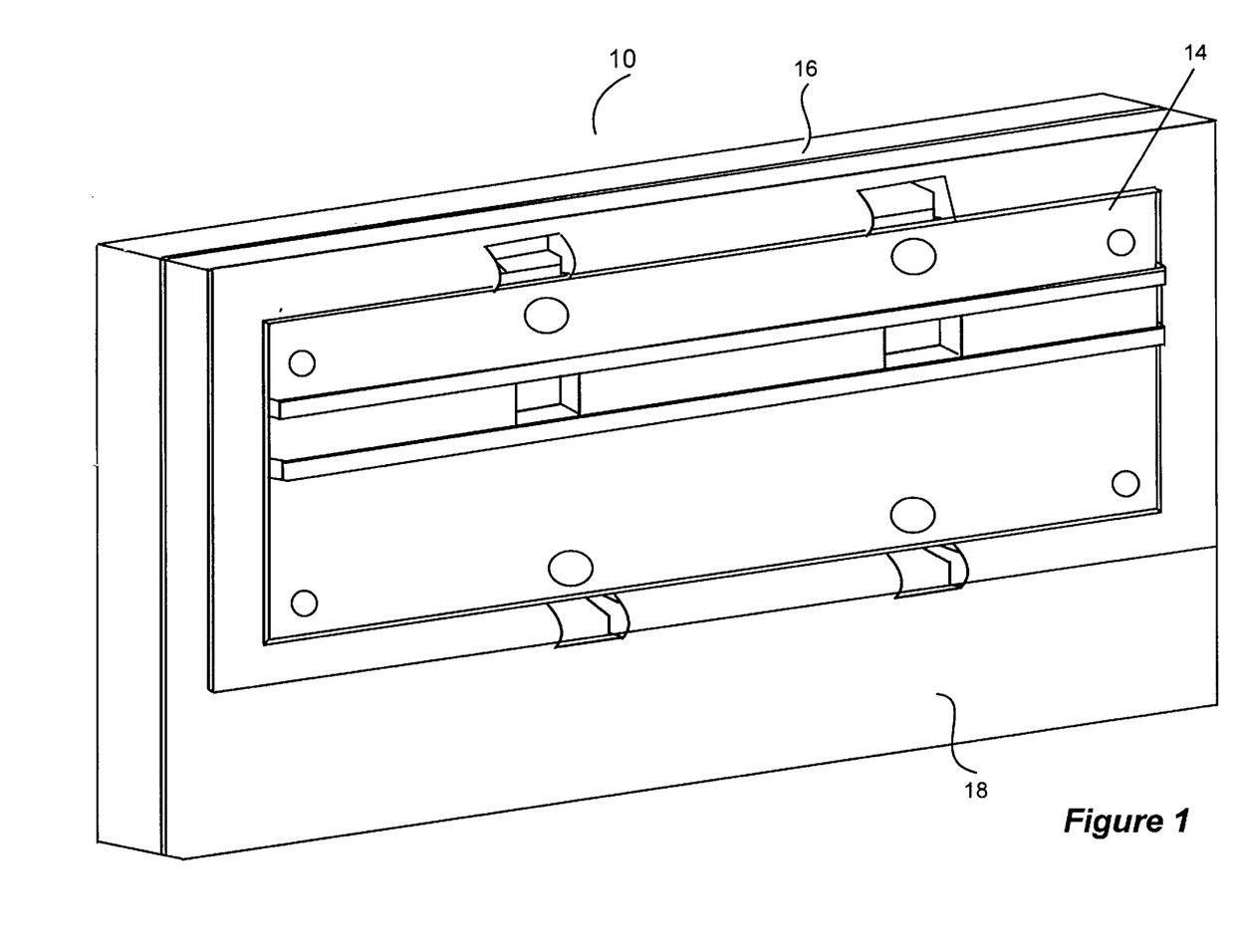
FIG. 1 is an assembled view of one embodiment of the processor card assembly of the present invention.
Figure 2:
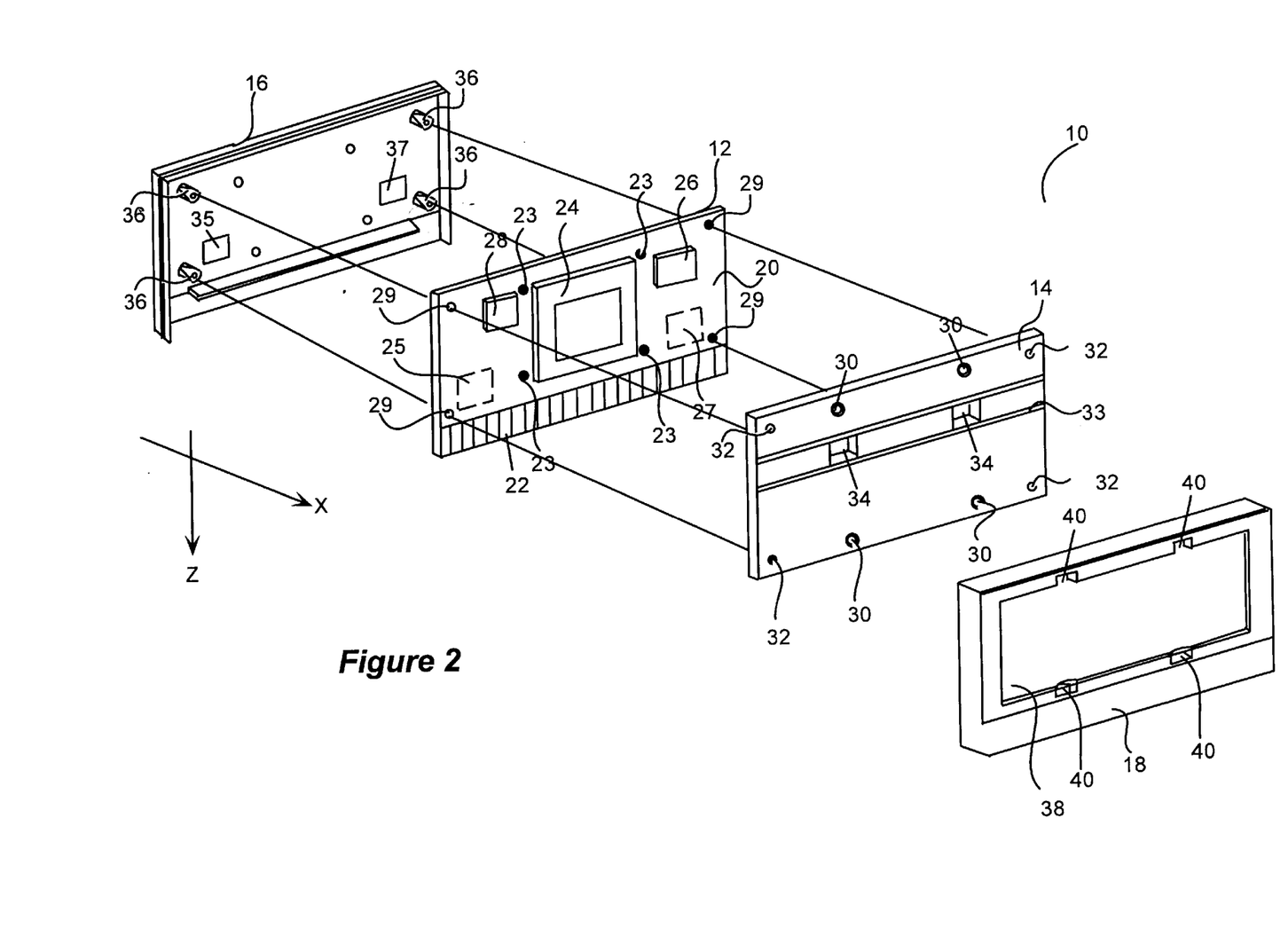
FIG. 2 is an exploded view of the processor card assembly of FIG. 1.

Referring now to FIGS. 1 & 2, wherein an assembled view and an exploded view of one embodiment of the processor card assembly of the present invention are shown. For the illustrated embodiment, processor card assembly 10 comprises processor card 12 (not visible in FIG. 1), metallic plate 14, back cover 16, and front cover 18. As will be described in more details below, in addition to being bonded to processor 24 disposed on processor card 12, metallic plate 14 is also attached to processor card 12, and serves as a base for further thermally coupling processor 24 to a heat sink (not shown in FIGS. 1–2). Additionally, metallic plate 14 and back cover 16 are attached to each other to form a Faraday cage for electro-magnetically shielding EMI emissions from processor 24, as well as for providing ESD protection to processor card 12. In other words, metallic plate 12 doubles up as a mounting base for heat sink, as well as a side wall of the Faraday cage. Front cover 18 has hollowed face 38, allowing it to be attached to processor card 12 to provide physical protections to connector pins 22 disposed on one edge of processor card 12, and yet still be able to allow a heat sink to be strapped to metallic plate 14.

For the illustrated embodiment, processor card 12 includes circuit board 20 and a number of heat dissipating integrated circuits 24–28 mounted thereon. In particular, integrated circuits 24–28 include processor 24. Some of the integrated circuits 24, 26 and 28, including processor 24, are disposed on metallic plate 14 side of circuit board 20, while other integrated circuits 25 and 27 are disposed on the back cover 16 side of circuit board 20. Circuit board 20 includes a first set of pre-drilled holes for facilitating attachment of metallic plate 14 to circuit board 20, and a second set of pre-drilled holes for facilitating attachment of metallic plate 14 to back cover 16. Processor card 12 further includes connector pins 22 disposed on a first edge of circuit board 20 for connecting processor card 12 to a motherboard (not shown) in the Z direction, by way of mating with a connector (not shown) disposed on the motherboard.

The number integrated circuits 24–28 shown, and the fact that some are disposed on one face of circuit board 20 while others are disposed in an opposing face, are for illustrative purpose only. Except for processor 24, and its disposition on the metallic plate side of circuit board 20, for the purpose of this invention, any number of integrated circuits may be included in processor card 12, and the non-processor integrated circuits may be disposed on both faces or on one face, and if they are all disposed on one face, it could be either face.

Similarly, the fastening features, i.e. pre-drilled holes, screws, threaded stems, described or to be described, are intended for illustrative purpose only, these fastening features may be substituted with any one of a number of fastening features known in the art or subsequently developed.

For the illustrated embodiment, metallic plate 14 includes a first set of pre-drilled holes 30 for facilitating attachment of metallic plate 14 to circuit board 20, and a second set of pre-drilled holes 32 for facilitating attachment of metallic plate 14 to back cover 16. Furthermore, metallic plate 14 includes longitudinal channel 33 having openings 34 disposed thereon for facilitating strapping of a heat sink to metallic plate 14. Similar to circuit board 20, the fastening features, i.e. pre-drilled holes 30 and 32, as well as channel 33 and openings 34 may be replaced with any one of a number of fastening features known in the art or subsequently developed.

For the illustrated embodiment, back cover 18 includes threaded stems 36 for facilitating attachment to metallic plate 14, and metallic pads 35 and 37 for removing heat from integrated circuits 25 and 27. Metallic pads 35 and 37 are "glued" to the interior face of back cover 18, and they are disposed in areas geometrically coordinated with the locations of integrated circuits 25 and 27. Obviously, the present invention may be practiced with other thermally conductive pads, or even without metallic pads 35 and 37 if there are no integrated circuits disposed on the back cover side of circuit board 20, or integrated circuits 25 and 27 dissipate only a minimal amount of heat.

For the illustrated embodiment, front cover 18 has hollowed face 38 to allow front cover 18 to be attached to circuit board 20 over metallic plate 14, thereby allowing a heat sink to be strapped to metallic plate 14. Front cover 18 also includes notches 40 disposed on the top and bottom sides for facilitating strapping of a heat sink of a different kind (in terms of form factors) to metallic plate 14. Front and back covers 18 and 16 are coordinated in height to provide physical protection to connector pins 22. In other words, once assembled, connector pins 22 are covered.

Figure 3:
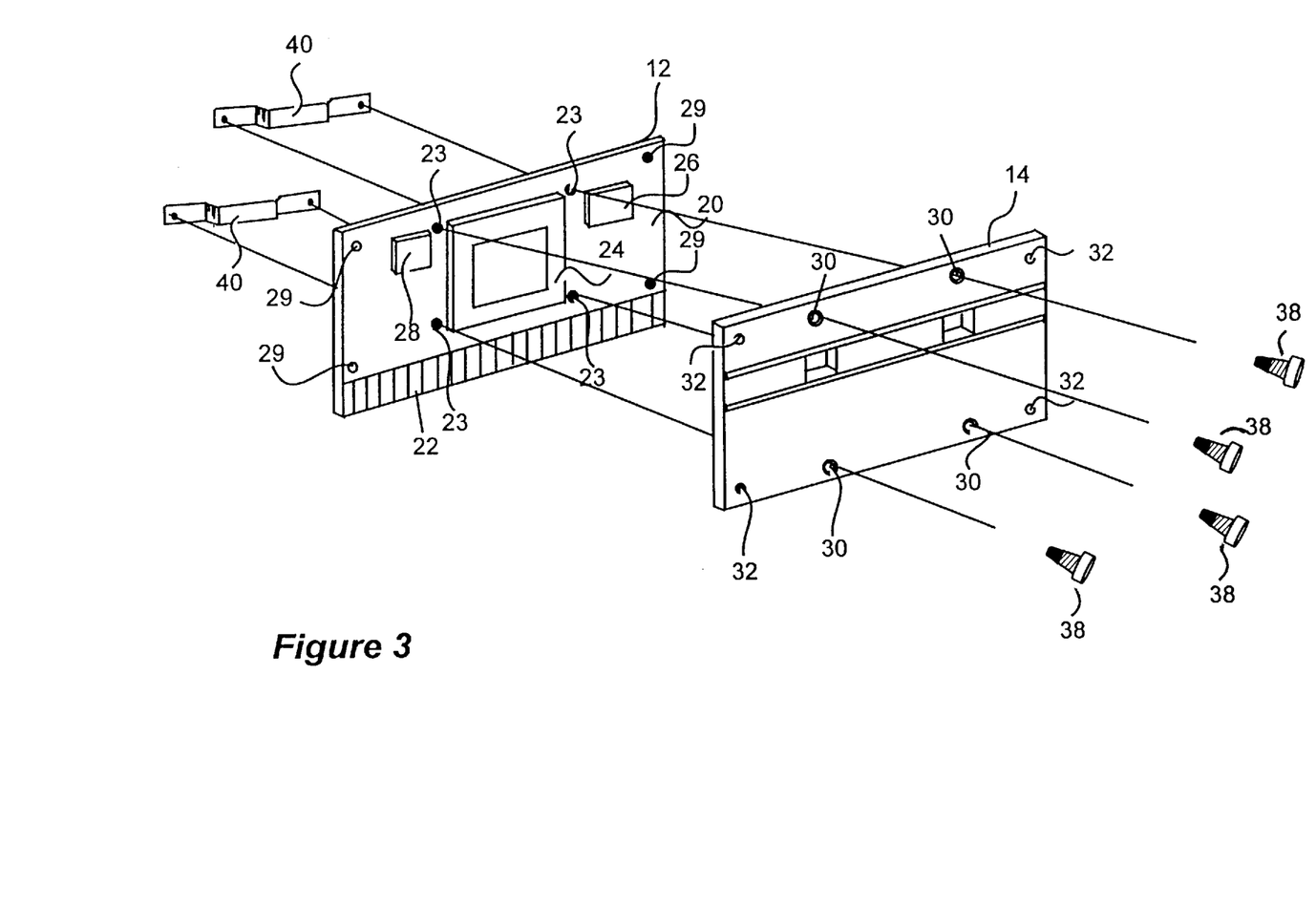
FIG. 3 illustrates how the metallic plate and the processor card of FIG. 1 are attached together.

FIG. 3 illustrates how processor card 12 and metallic plate 14 are attached together. As described earlier, in addition to being thermally coupled processor 14, using thermal adhesive of suitable thermal characteristics (which is processor dependent), as shown, for the illustrated embodiment, processor card 12 and metallic plate 14 are joined together in the X direction (orthogonal to the Z direction), using screws 38 and brackets 40, through pre-drilled holes 30 on metallic plate 14 and pre-drilled holes 23 on circuit board 20.

Figure 4:
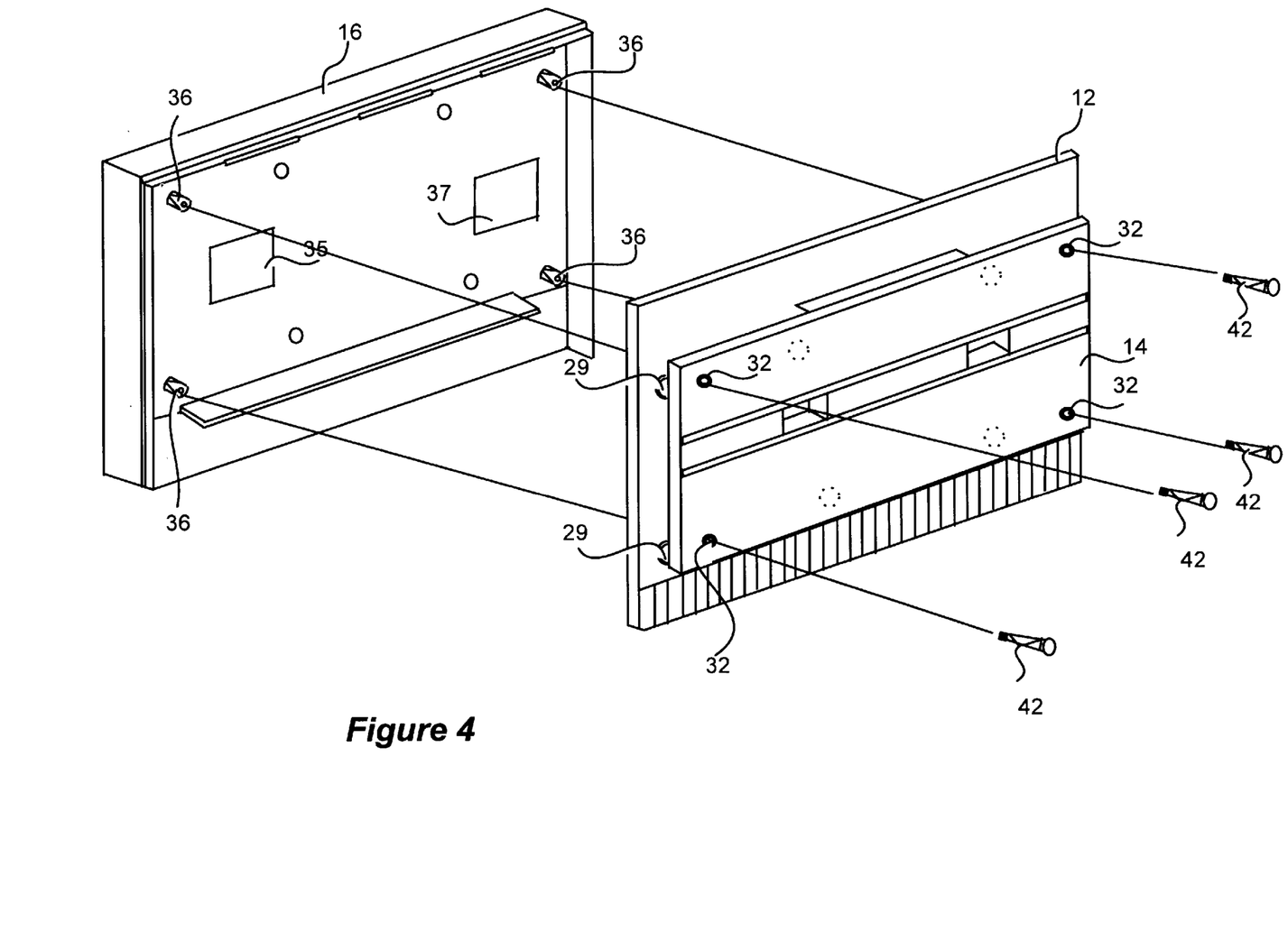
FIG. 4 illustrates how the back cover and the combined processor card and metallic plate of FIG. 1 are attached together.

FIG. 4 illustrates how back cover 16 is joined to the combined processor card 12 and metallic plate 14. As shown, for the illustrated embodiment, back cover 16 includes a set of threaded stems 36 for facilitating attachment to the combined processor card 12 and metallic plate 14 in the X direction, using screws 42, through pre-drilled holes 32 on metallic plate 14 and pre-drilled holes 29 on circuit board 20.

Figure 5:
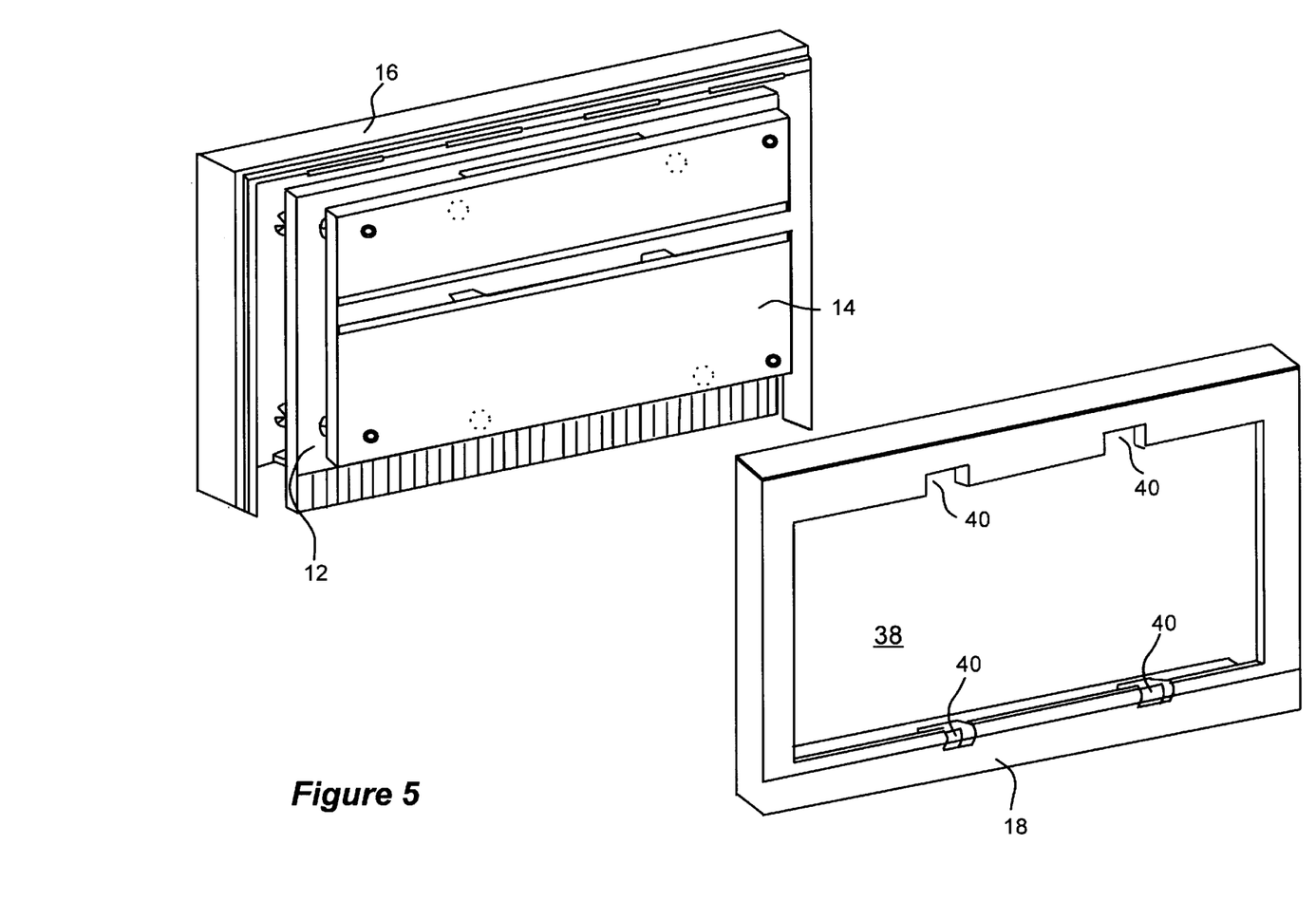
FIG. 5 illustrates how the hollowed front cover is attached to the processor card, metallic plate and back cover subassembly.

FIG. 5 illustrates how front cover 18 is joined to the combined processor card 12, metallic plate 14 and back cover 16. As shown, for the illustrated embodiment, front cover 16 is joined with the processor card 12, metallic plate 14, and back cover 16 in the X direction, by ultrasonically bonding the perimeters of front cover 18 to circuit board 20.

Figure 6:
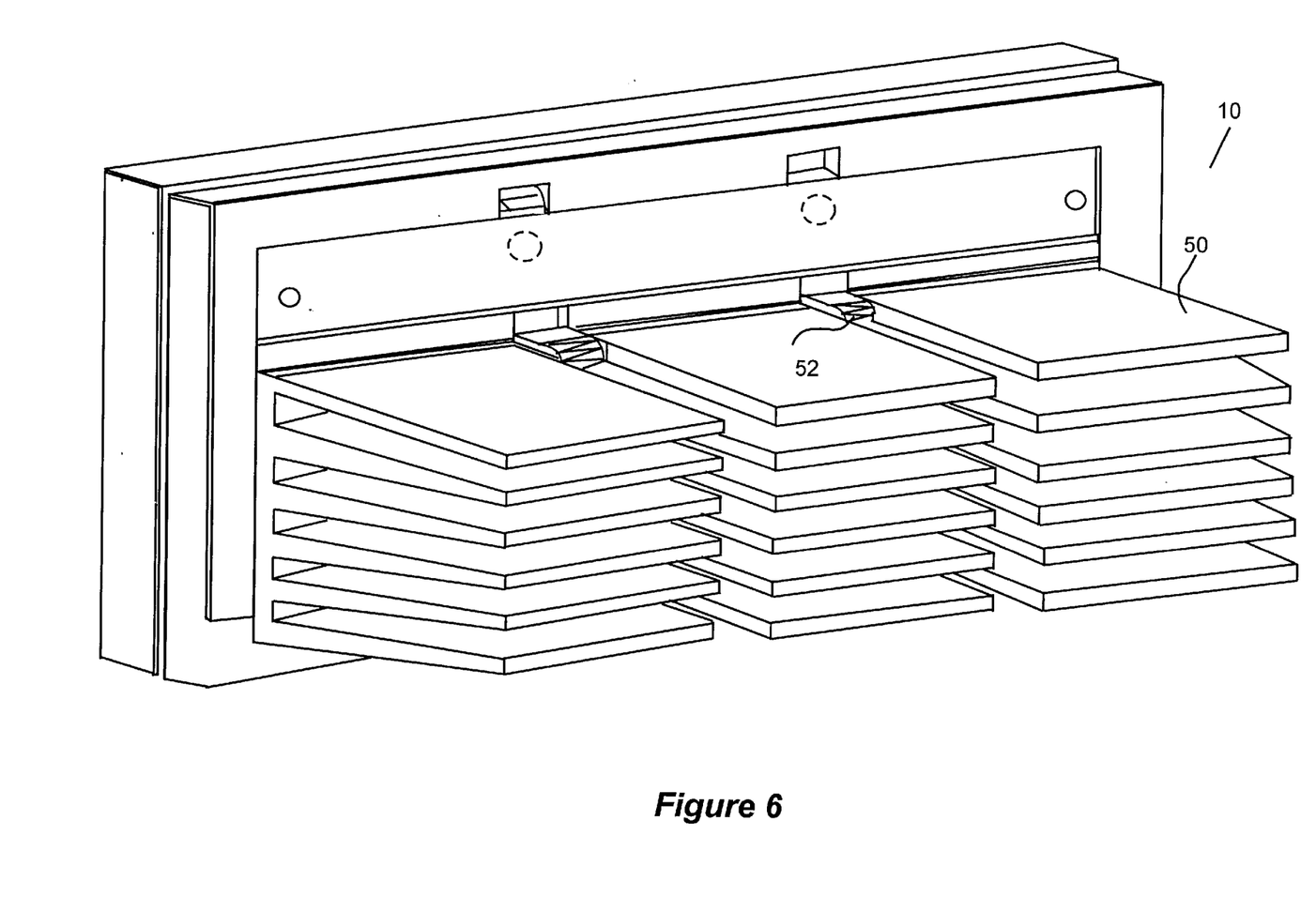
FIGS. 6–7 illustrate the processor card assembly of the present invention strapped with two embodiments of heat sinks for two different system chassis.
Figure 7:
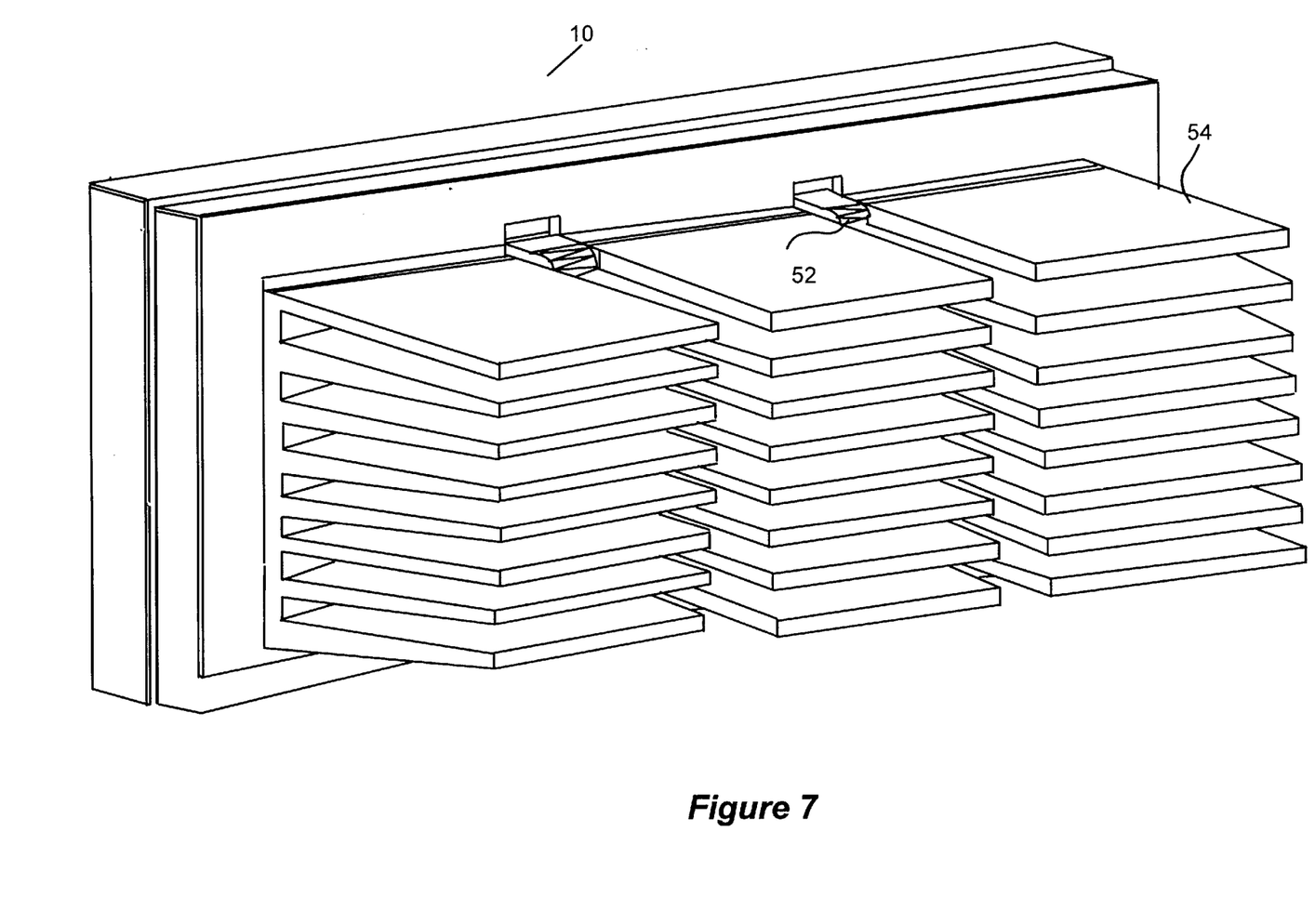

FIGS. 6–7 illustrates how heat sinks of different kinds are strapped to processor card assembly 10 of the present invention. In FIG. 6, heat sink 50 having form factors suitable for a "low" profile system chassis is strapped to processor card assembly 10 using spring bracket 52, by way of openings 34 disposed on longitudinal channel 32 of metallic plate 14, whereas in FIG. 7, heat sink 54 having form factors suitable for a "standard" profile system chassis is strapped to processor card assembly 10 using spring clip 52, by way of notches 40 disposed on the top and bottom sides of front cover 18.

The form factors of heat sinks 50 and 54 and the usage of clip 52 are for illustrative purpose only. As will be appreciated by those skilled in the art, heat sinks having other form factors, requiring alternative manners for attaching them to the processor card assembly 10 of the present invention may be employed, provided the "fastening features" of processor card 12, metallic plate 14, back cover 16 and front cover 18 are modified accordingly.

Figure 8:
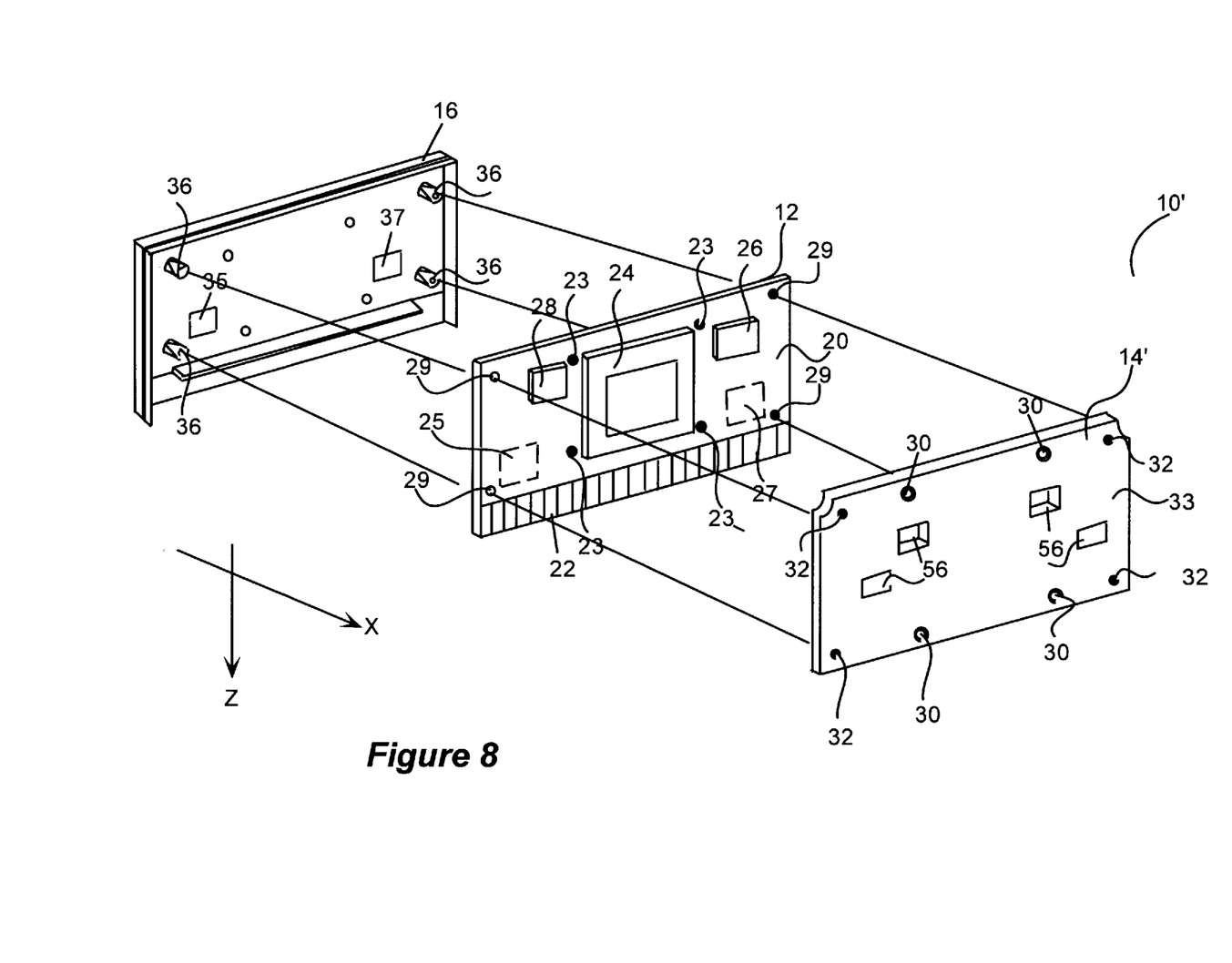
FIG. 8 illustrates an alternate embodiment of the present invention.

FIG. 8 illustrates an alternative embodiment of the present invention. For this illustrated alternative embodiment, processor card assembly 10' includes only processor card 12, metallic plate 14', and back cover 16. In other words, compare to the earlier described embodiment, front cover 18 is not employed. Metallic plate 14' is wider, but shorter than previously described metallic plate 14. Metallic plate 14' is designed to provide full horizontal coverage of circuit board 12, but exposing connector pins 22. Furthermore, metallic plate 14' is provided with multiple sets of mounting slots 56 (as opposed to longitudinal channel 33) for directly mounting a selected one of different embodiments of heat sinks. Otherwise, processor card 12, metallic plate 14', and back cover 16 are joined and cooperate together in like manner as earlier described to facilitate post assembly mounting of a selected one of different embodiments of hear sink, EMI shielding as well as ESD protection.

While the method and apparatus of the present invention has been described in terms of the above illustrated embodiments, those skilled in the art will recognize that the invention is not limited to the embodiments described. The present invention can be practiced with modification and alteration within the spirit and scope of the appended claims. For example, back and/or front covers may further include fastening features for engaging the processor card assembly with an retention apparatus for securing the processor card assembly, so that the connector pins of the processor card will remain properly engaged to the connector of the motherboard. The description is thus to be regarded as illustrative instead of restrictive on the present invention.

Thus, a processor card assembly having a heat sink attachment plate and an EMI/ESD shielding cage has been described.

What is claimed is:

1. A processor card assembly comprising:

a processor card including a circuit board having a processor mounted thereon, the circuit board having a first and a second plurality of fastening features;

a metallic plate having a third and a fourth plurality of fastening features, the third plurality of fastening features cooperating with the first plurality of fastening features for physically attaching and thermally coupling the processor card to the metallic plate;

a back cover having a fifth plurality of fastening features that cooperate with the second plurality of fastening features of the circuit board and the fourth plurality of fastening features of the metallic plate, to allow the metallic plate and the back cover to physically and electro-magnetically enclose the processor card to reduce electro-magnetic interference emissions and/or shield electrostatic discharges from the processor; and wherein the metallic plate further includes a sixth plurality of fastening features selectively employed to removably accept a selected one of a plurality of alternative heat sinks external to said assembly.

2. The processor card assembly as set forth in claim 1, wherein the circuit board further comprises a plurality of connecting pins disposed on a first edge for electrically connecting the processor card to a connector in a direction orthogonal to the direction the processor card and the metallic plate physically attach and thermally couple to each other.

3. The processor card assembly as set forth in claim 2, wherein the circuit board and the back cover are coordinated in height, providing physical protection to the connecting pins prior to their connection to the connector.

4. The processor card assembly as set forth in claim 1, wherein the processor is mounted on a first face of the circuit board, and the circuit board further having a heat dissipating component mounted on a second face of the circuit board, the first and second faces being opposing faces of the circuit board; and the back cover is further used for thermally removing heat dissipated by the heat dissipating component.

5. The processor card assembly as set forth in claim 4, wherein the back cover includes an interior face and a thermally conductive pad, the thermally conductive pad being surface mounted on the interior face in an area that is geometrically coordinated with where the heat dissipating component is mounted on the second face of the circuit board.

6. The processor card assembly as set forth in claim 1, wherein the metallic plate further comprises a channel longitudinally spanning the metallic plate, and the sixth plurality of fastening features include a plurality of openings for strapping the heat sink to the metallic plate.

7. The processor card assembly as set forth in claim 1, wherein the processor card assembly further comprises a front cover having a hollow face for attaching to the circuit board over the metallic plate, which is exposed through the hollow face.

8. The processor card assembly as set forth in claim 7, wherein front cover further comprises a plurality of perimeter notches for facilitating strapping of the heat sink to the metallic plate.

9. The processor card assembly as set forth in claim 7, wherein the circuit board further comprises a plurality of connecting pins disposed on a first edge for electrically connecting the processor card to a connector in a direction orthogonal to the direction the processor card and the metallic plate physically attach and thermally couple to each other; and the circuit board and the front cover are coordinated in height, providing physical protection to the connecting pins prior to their connection to the connector.

\* \* \* \* \*

UNITED STATES PATENT AND TRADEMARK OFFICE
CERTIFICATE OF CORRECTION

PATENT NO.    : 5,838,542
DATED         : November 17, 1998
INVENTOR(S)   : Nelson et al.

It is certified that error appears in the above-identified patent and that said Letters Patent is hereby corrected as shown below:

<u>Title page,</u>
Item [75], delete "Darul" and insert -- Daryl --.

Signed and Sealed this

Fifth Day of August, 2003

JAMES E. ROGAN
*Director of the United States Patent and Trademark Office*